(12) United States Patent
Lorenz (10) Patent No.: US 10,305,503 B2
(45) Date of Patent: May 28, 2019

(54) ANALOG TO DIGITAL CONVERSION WITH PULSE TRAIN DATA COMMUNICATION

(71) Applicant: Texas Instruments Incorporated, Dallas, TX (US)

(72) Inventor: Perry Scott Lorenz, Fort Collins, CO (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/193,985

(22) Filed: Feb. 28, 2014

(65) Prior Publication Data
US 2014/0253358 A1    Sep. 11, 2014

Related U.S. Application Data

(60) Provisional application No. 61/774,096, filed on Mar. 7, 2013.

(51) Int. Cl.
*H03M 1/12* (2006.01)
*H03M 1/56* (2006.01)
*H04B 14/02* (2006.01)

(52) U.S. Cl.
CPC ............. *H03M 1/56* (2013.01); *H04B 14/02* (2013.01)

(58) Field of Classification Search
CPC ... H03M 2201/4135; H03M 2201/198; H03M 2201/4105; H03M 2201/4125; H03M 2201/1163; H03M 2201/2291; H03M 2201/24; H03M 2201/4155; H03M 2201/4175; H03M 2201/6171; H03M 1/12; H03M 1/60; H03M 1/52; H03M 1/504

USPC ....... 341/155, 157, 158, 164–167, 173, 187, 341/184

See application file for complete search history.

(56) References Cited

U.S. PATENT DOCUMENTS

| | | | | |
|---|---|---|---|---|
| 3,701,145 A | * | 10/1972 | Bergin | H03M 1/58 341/140 |
| 4,754,257 A | * | 6/1988 | Takahashi | 341/157 |
| 5,182,561 A | * | 1/1993 | Sasaki | H03M 1/162 341/127 |
| 5,325,398 A | * | 6/1994 | Murakami | G06F 3/033 341/184 |
| 5,485,153 A | * | 1/1996 | Park | G06F 1/022 341/144 |

(Continued)

*Primary Examiner* — Linh V Nguyen
(74) *Attorney, Agent, or Firm* — Andrew Viger; Charles A. Brill; Frank D. Cimino (57) ABSTRACT

A methodology for capturing analog information, such as from an analog sensor, including converting the analog information to a train of pulses, representing the analog information as the number of pulses in the pulse train. This pulse count data can be communicated to a processor configured to count the pulses in the pulse train, and convert this pulse count data into digital data corresponding to the analog information. An example embodiment uses a DAC/comparator to convert the analog information (such as a sensor reading) into a pulse train derived from a DAC count (such as can be generated by a DAC counter from an input DAC clock) that is compared with an analog magnitude (analog information), such that the DAC count, which can be represented by a number of DAC clock pulses, provides the pulse train (pulse count data) that corresponds to the analog information.

15 Claims, 5 Drawing Sheets

(56) References Cited

U.S. PATENT DOCUMENTS

| | | | | |
|---|---|---|---|---|
| 5,559,514 | A | * | 9/1996 | Thomson .................. G01K 1/20 341/143 |
| 6,140,952 | A | * | 10/2000 | Gaboury ........................ 341/143 |
| 9,768,792 | B1 | * | 9/2017 | Decaux ................. H03M 3/498 |
| 2009/0201172 | A1 | * | 8/2009 | Edell .................... A61B 5/0002 340/870.3 |

* cited by examiner

ANALOG TO DIGITAL CONVERSION WITH PULSE TRAIN DATA COMMUNICATION

CROSS-REFERENCE TO RELATED APPLICATIONS

Priority is hereby claimed under USC § 119(e) to U.S. Provisional Application 61/774,096 (filed Mar. 7, 2013).

BACKGROUND

Technical Field

This Patent Document relates generally to conversion of analog information to digital form such as for processing and/or control, and more specifically to converting analog information to digital data communicated for example to a processor or controller, such as can be used in sensor systems in which sensed physical state or condition (such as temperature or pressure) is converted to digital form and communicated to a processor/controller.

Related Art

Analog to digital sensor systems can be based either on analog or digital sensors. In either case, an analog sensor senses analog information corresponding to a physical state or condition (such as for temperature or pressure).

Analog sensors transmit the sensed analog information for example to a processor/controller, which converts the analog information to digital form for processing (such as for controlling or logging). Digital sensors either integrate or couple to an analog sensor, and perform analog to digital conversion and data communication.

Digital sensors perform data communication according to various encoding/communication protocols. For example, the sensor information can be converted and communicated in the form of frequency, period, delay, pulse width or duty cycle information, which is measured at the receive end to recover the sensor information. Alternatively, sensor information can be digitally encoded for communication according to a digital communication protocol including a clock (either embedded or separate), which is decoded at the receive end (based on a recovered clock) to recover the sensor information. Two common communication protocols for communicating encoded digital sensor data are SPI and I²C.

While this Background information is presented in the context of sensor applications, this Patent Document is not limited to such applications, but is more generally directed to analog to digital conversion with data communication such as to a processor/controller.

BRIEF SUMMARY

This Brief Summary is provided as a general introduction to the Disclosure provided by the Detailed Description and Figures, summarizing some aspects and technical features of the disclosed invention(s). It is not a detailed overview of the Disclosure, and should not be interpreted as identifying key elements of the invention(s), or otherwise characterizing the scope of the invention(s) disclosed in this Patent Document.

The Disclosure describes apparatus and methods adapted to capturing/converting analog information as pulse count digital data according to aspects of the invention, such as can be used in embodiments and applications in which sensor analog information is captured and converted to a pulse train of pulse count digital data for communication to a processor/controller.

Embodiments of the invention operable in capturing/converting analog information as pulse count data can include: (a) input circuitry configured to provide an input signal corresponding to the analog information; (b) pulse count circuitry configured to convert the input signal into pulse count data in which the analog information is represented by a number of pulses (pulse train); and (c) data communication circuitry configured to communicate the pulse count data to a processor (such as a microprocessor, microcontroller or embedded processor). For example, in various embodiments, the analog information can be the analog sensor output of a sensor that senses a physical state (such as temperature), such that the pulse count data (the train of pulses) corresponds to the sensor analog output.

In an one implementation, the input circuitry can be configured to include: (a) digital counter circuitry responsive to a start count signal, and configured to output a digital count that increases according to a predetermined count frequency from the start count signal until a stop count signal is received; (b) digital to analog conversion (DAC) circuitry configured to generate an analog DAC output that increases in magnitude corresponding to the increase in the digital count; and (c) comparison circuitry configured to generate the stop count signal when the analog DAC output is substantially equal to an analog magnitude corresponding to the analog information. For this example implementation, the number of pulses in the pulse count data (the pulse train) corresponds to a DAC count equal to the digital count between the start count signal and the stop count signal, which can be represented by a corresponding train of clock pulses input to a DAC counter.

In another implementation, the pulse count circuitry can be configured to convert the analog information into either the pulse count data, or pulse count information corresponding to the pulse count data, and then storing this pulse count data/information. For this example implementation, the pulse count circuitry is configured to enable communication of the pulse count data by either retrieving the pulse count data from the storage circuitry, or retrieving the pulse count information from the storage circuitry, and then generating the pulse count data from the pulse count information. In either case, the example implementation enables decoupling capturing the analog information from communicating the corresponding pulse count data.

Other aspects and features of the invention claimed in this Patent Document will be apparent to those skilled in the art from the following Disclosure.

BRIEF DESCRIPTION OF THE DRAWINGS

FIGS. 3-5 illustrate example implementations of a digital sensor system configured with an analog temperature sensor, and with pulse count generation implemented with a DAC/comparator ADC such that the DAC count (DAC clock pulse train) provides the Pulse Count Data. These example implementations are illustrated with different example pin configurations:

DETAILED DESCRIPTION

This Description and the Figures disclose example embodiments and applications, that illustrate various aspects and technical features of the invention disclosed and claimed in this Patent Document. Known circuits, functions and operations are not described in detail to avoid unnecessarily obscuring the principles and features of the claimed invention.

In brief overview, example embodiments of the invention are operable or employable to capture analog information as Pulse Count Data by: (a) converting analog information into Pulse Count Data in which the analog information is represented by a number of pulses in a pulse train; and (b) communicating the Pulse Count Data (as a pulse train) to a processor configured to count the number of pulses in the Pulse Count Data (pulse train), and thereby receive the analog information. In an example application, the analog information is provided by an analog sensor that senses a physical state or condition such as temperature or pressure.

The Pulse Count Data is not a form of data encoding, but instead, analog information (such as a sensed physical state) is converted into a train of pulses with a corresponding pulse count such that the analog information can be received/recovered by counting the number of pulses in the pulse train that constitutes the Pulse Count Data. That is, Pulse Count Data is a pulse train with starting pulse and an ending pulse. The pulse counting operation can be substantially independent of frequency, period, duty-cycle or pulse width, and can be substantially independent of pulse rising and falling edge slew rate.

In an example adaptation of this methodology, the conversion to Pulse Count Data is accomplished by generating a DAC count corresponding to the analog information, including: (a) generating, responsive to a start count signal, a digital count that increases according to a predetermined count frequency from the start count signal until a stop count signal is received; (b) performing a digital to analog conversion to generate an analog DAC output that increases in magnitude corresponding to the increase in the digital count after the start count signal; and (c) comparing the analog DAC output to an analog magnitude corresponding to the analog information, and generating the stop count signal when they are substantially equal, such that the DAC count corresponds to the number of pulses equal to the digital count between the start count signal and the stop count signal.

In another example adaptation of this methodology, the analog information is converted into either Pulse Count Data, or pulse count information corresponding to the Pulse Count Data, which can be stored prior to communication, decoupling capturing/converting analog information from communicating the corresponding Pulse Count Data (pulse train). In this example adaptation, communicating the Pulse Count Data is enabled by one of: (a) retrieving the Pulse Count Data from the storage circuitry, and (b) retrieving the pulse count information from the storage circuitry, and generating the Pulse Count Data from the pulse count information The Pulse Count Data representing the captured analog information can be communicated to a processor (such as a microprocessor or microcontroller or embedded processor) that processes or otherwise operates on or responds to the sensor output (such as by controlling, regulating, logging, etc.).

Figure 1:
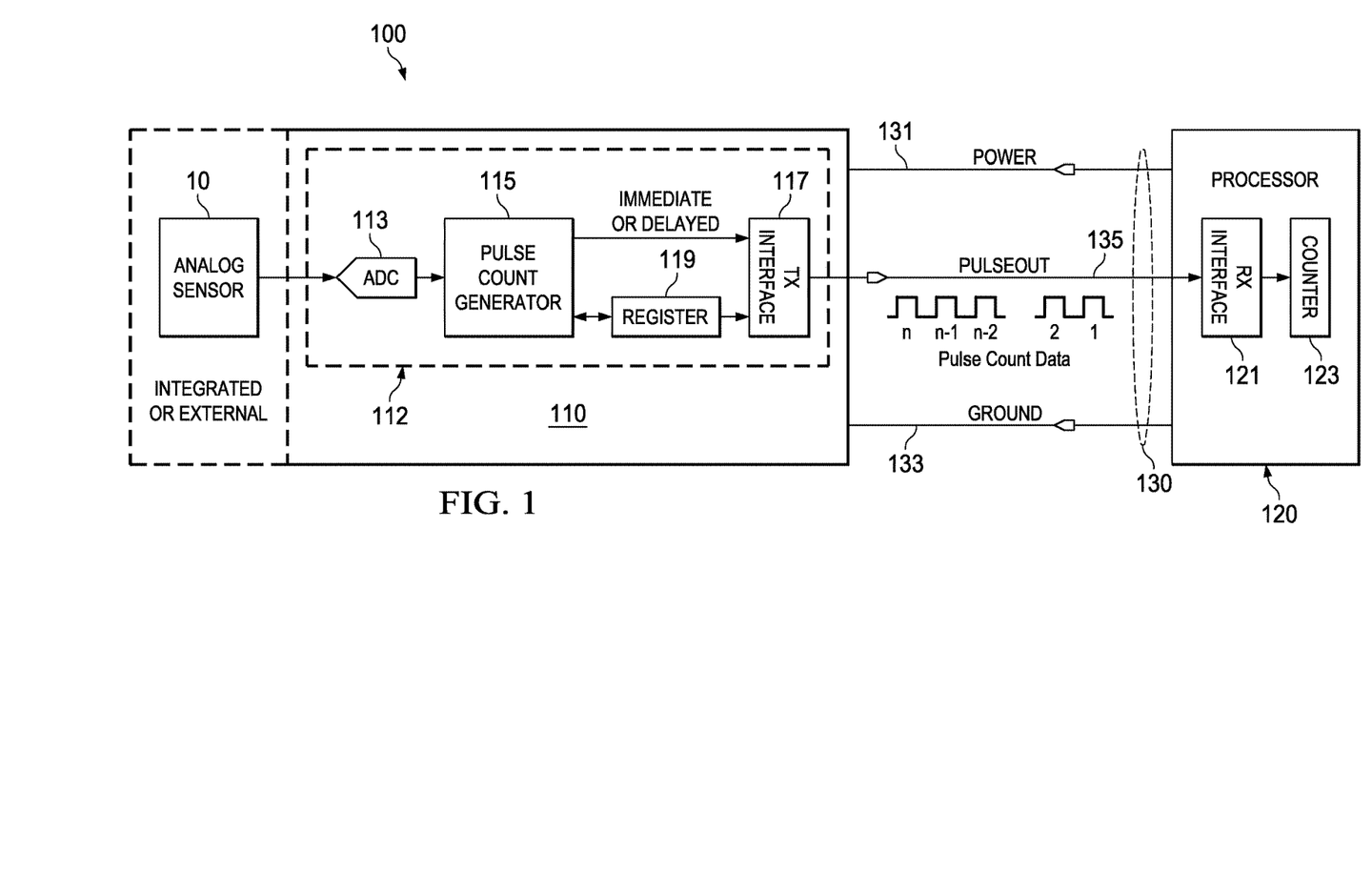
FIG. 1 illustrates an example embodiment in which a methodology for capturing/converting analog information as Pulse Count Data (a train of pules) according to aspects of the invention is adapted to a digital sensor system with Pulse Count Data communication to a processor.

FIG. 1 illustrates an example embodiment in which the methodology for capturing/converting analog information as Pulse Count Data according to aspects of the invention is adapted as a digital sensor system including Pulse Count Data communication to a processor. A sensor system 100 includes a digital sensor 110 coupled to a processor 120, through a system interface 130.

The digital sensor 100 includes an analog sensor 10 and sensor electronics 112. Analog sensor 10 can be integrated with sensor electronics 112, or located externally (including remotely), as represented by the dashed block for the analog sensor.

Functionally, the digital sensor electronics 112 includes an ADC (analog to digital converter) 113, a pulse count generator 115 and a data communication/transmitter TX 117. In addition to this signal/data path, the digital sensor can include a register (or other memory/storage element) 119.

For this example embodiment, system interface 130 is implemented as a 3-pin interface: power 131 and ground 133, together with a signal (I/O) line 135. The specific implementation of system interface 130, including a suitable communication/control protocol, and including a pin configuration, is a design choice. For example, FIGS. 3-5, discussed below, illustrate other example embodiment with different system interfaces.

The analog information sensed/captured by analog sensor 111 is converted to Pulse Count Data in which the analog information is represented by a pulse count (a number of pulses). As illustrated by the functional blocks in FIG. 1, ADC 113 converts the output from analog sensor 111 into a digital representation of the analog information. The pulse count generator 115 then converts this digital representation of the sensed analog information into Pulse Count Data, according to aspects of the invention.

Pulse count data can be communicated directly to processor 120 as it is generated, or data capture/conversion can be decoupled from data communication. For example, sensor data can be captured/converted at a lower rate than the data communication frequency.

In one example embodiment, pulse count generator 115 can be configured to output Pulse Count Data directly to TX 117 for immediate transmission as Pulse Count Data to processor 120. For example, sensor system 100 can be configured such that processor 120 signals digital sensor 110 to initiate a capture/conversion cycle, and directly communicate back corresponding Pulse Count Data representing the captured analog information.

In an alternate example embodiment, Pulse Count Data can be stored in register 119 for delayed communication independent of the generation (capture/conversion) of the Pulse Count Data. For example, sensor system 100 can be configured such that in response to a request from, or independent of, processor 120, digital sensor 110 initiates capture/conversion cycle, converting captured analog sensor information into either Pulse Count Data or pulse count information representative of the Pulse Count Data, and then storing in register 119 the corresponding Pulse Count Data/information. After a capture/conversion cycle, Pulse Count Data can be communicated back to the processor, initiated either by a processor request for sensor data transfer, or by the digital sensor signaling sensor data ready to the processor.

Data communication is implemented by TX 117, which is configured to transmit Pulse Count Data over signal line 135 as a pulse train [1, 2, . . . n–2, n–1, n]. The transmitted Pulse Count Data comprises a train of n pulses where the pulse count [1, 2, . . . n–2, n–1, n] corresponds to analog sensor information embodied in a sensor reading. For example, the pulse count n can correspond to a magnitude value for a sensed physical state, such as the magnitude of analog information sensed/captured by analog sensor 111. As illustrated, a Pulse Count Data transmission is a pulse train that starts with a first pulse n=1, and ends with an $n^{th}$ pulse.

If a sensor system implementation supports decoupling pulse count data capture/conversion from communication, such as by storing data/information a register 119 (or other memory) for delayed communication, then in alternate example embodiments: (a) if Pulse Count Data is stored in register 119, TX interface 117 can be configured to retrieve the Pulse Count Data directly from the register, or (b) if pulse count information (rather than data) is stored in the register, then pulse count generator 115 can be configured to retrieve the pulse count information, and convert it to Pulse Count Data for transmission by the TX 117. Pulse count data can be communicated as voltage or current pulses.

Thus, the example digital sensor 110 performs the following operations/functions: (a) capture—sensing/capturing analog information (sensor 111), (b) conversion—converting sensed analog information to Pulse Count Data (ADC 113 and pulse count generator 115), (c) communication—data communication (TX 117).

A capture/conversion cycle can be initiated by the processor, or by the sensor. For example, the processor could signal Start (see, FIG. 3), which would initiate a capture/conversion cycle followed by pulse train communication. As another example, a capture/conversion cycle could be initiated by power-up, followed by pulse train communication and power-down in preparation for the next power-up-initiated capture/conversion cycle. As another example, the sensor could independently initiate one or more capture/conversion cycles, followed by communication.

In another example embodiment, capture/conversion can be decoupled from communication by introducing a memory operation (register 119) in which captured analog information is converted to Pulse Count Data or corresponding pulse count information which is then stored for delayed communication. For this example embodiment, the conversion operation can include two phases: first, conversion to Pulse Count Data/Information stored in memory, and second, retrieval and communication, including if necessary conversion from pulse count information to Pulse Count Data.

Introducing a memory operation to decouple conversion from communication can, for example, enable using relatively long capture/conversion cycles (more settling time, less power and die area) with relatively high frequency, burst communication. A conversion/memory cycle can be initiated by the processor, by the sensor, or can be continuous, either storing multiple conversions for burst communication, or storing a current conversion by overwriting a previous conversion with burst communication of the current conversion stored in memory.

The digital sensor 110 is coupled to a processor 120 configured to receive Pulse Count Data from the digital sensor, initiated according to a suitable communication protocol. The example processor includes a data communication/receiver RX 121 configured to receive the Pulse Count Data (pulse train), and a pulse counter 123, configured to: (a) count the pulses in the pulse train [1 to n]; and (b) generate a corresponding, internal digital data representation of the analog sensor information captured by digital sensor 110 and embodied in the converted Pulse Count Data communicated as the pulse train [1, 2, . . . n–2, n–1, n]. This pulse counting operation can be substantially independent of frequency, period, duty-cycle or pulse width, and can be substantially independent of pulse rising and falling edge slew rate.

Processor 120 can convert the Pulse Count Data into a digital data representation of the analog sensor information embodied in the pulse count by a pulse-count-to-information operation. For example, in the case of a digital temperature sensor, the processor can use an equation to convert the pulse count into a look-up table address for retrieving the corresponding pulse count-to-temperature value. An example pulse-count-to-temperature conversion based on [200–count=T (in ° C.)] can be used to generate the following conversion values that can be stored in a look-up-table:

| Pulses | Temperature |
|---|---|
| 50 | 150° C. |
| 100 | 100° C. |
| 101 | 99° C. |
| 150 | 50° C. |
| 151 | 49° C. |
| 200 | 0° C. |
| 201 | –1° C. |
| 240 | –40° C. |
| 256 | –56° C. max count |

For the example embodiment in FIG. 1, pulse count generation is accomplished with an ADC 113 and pulse count generator 115, illustrated as functional blocks. The specific implementation of the pulse count generation circuitry is a design choice.

Figure 2:
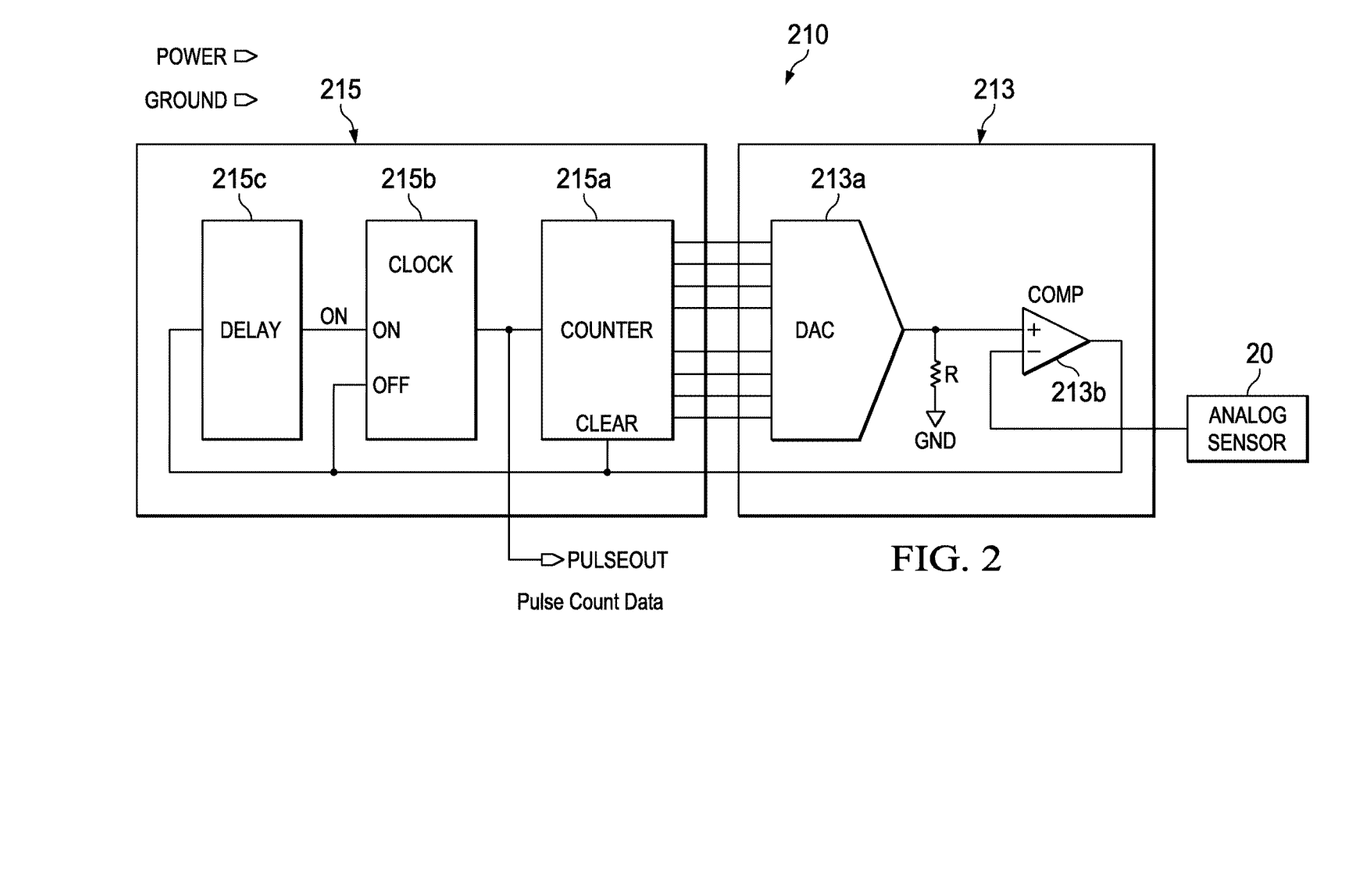
FIG. 2 illustrates an example embodiment of a digital sensor system in which pulse count generation is implemented with a DAC/comparator ADC such that the DAC count, as represented by a corresponding train of clock pulses input to a DAC counter, provides the Pulse Count Data, and uses a 3 pin interface between the digital sensor and the processor: Power, Ground, PulseOut (the clock pulse train from the DAC clock).

FIG. 2 illustrates an example implementation of a digital sensor 210 in which pulse count generation is implemented with a DAC/comparator ADC 213 in combination with a pulse count generator 215 implemented as a DAC counter. DAC/comparator ADC 213 includes a DAC (for example, unary) 213a and a comparator 213b. Pulse count generator 215 includes a DAC counter 215a (for example, 8-bit) clocked by a DAC clock 215b.

Once DAC clock 215a is initiated, it supplies a clock pulse train to the DAC counter 215a. DAC counter 215a provides a corresponding DAC count to the DAC 213a, which converts the DAC count into an analog voltage output to comparator 213b. Thus, the clock pulse train from DAC clock 215b corresponds to the DAC count from DAC counter 215a, which corresponds to the Pulse Count Data. For this example implementation, DAC count and DAC clock pulse train are equivalent, with the DAC clock pulse train provide the Pulse Count Data output from the sensor 210.

For this example embodiment, a sensor capture/conversion and communication cycle is initiated periodically using a delay circuit 215c that initiates clock 215b at a predetermined delay after a previous capture/conversion and communication cycle, thereby initiating DAC counter 215a.

Alternatively, as described below, the processor (120 in FIG. 1) can initiate a capture/conversion and communication cycle.

In accordance with conventional operation of a DAC/Comparator ADC, the increasing DAC count (as embodied in the clock pulses from DAC counter 215*b* are translated into an analog DAC voltage input to the comparator, which is coupled to receive at its other input the output of the analog sensor 20. The DAC count increases, and the resulting DAC voltage increases, until the comparator 213*b* transitions when the input DAC voltage rises to the input sensor voltage, stopping the DAC clock 215*b* and terminating the DAC count, and thereby ending the capture/conversion cycle. In addition to stopping the DAC clock 215*b*, the comparator transition output clears the DAC counter 215*a* and resets the delay circuit 215*c*, in preparation for the next periodic capture/conversion cycle.

The example implementation illustrated in FIG. 2 is not configured for delayed communication, so that capture/conversion is not decoupled from communication. Specifically, sensor 210 does not include a register or other memory structure as illustrated in the functional diagram in FIG. 1 (register 119), and therefore does not include a memory operation/function. Configuration for decoupled capture/conversion and communication is a design choice.

The clock pulse train from DAC clock 215*b* provides the Pulse Count Data that corresponds to the analog information from sensor 20. That is, for this example implementation, Pulse Count Data is communicated during conversion. Clock train pulses from the DAC clock are driven out onto the signal line (FIG. 1, 135) through the PulseOut pin, forming the pulse train that comprises the Pulse Count Data.

This example embodiment is implemented with a 3 pin interface between the digital sensor and the processor: Power, Ground and PulseOut (Pulse Count Data). As described above, capture/conversion/communication cycles are initiated periodically by delay circuit 215*c*. Alternatively, the sensor system can be configured for asynchronous, processor-initiation of capture/conversion and communication cycles. Referring also to FIG. 1, for example, the processor 120 can include a pull-up resistor on the signal (I/O) line 135 connected to the PulseOut pin (open drain at both ends), so that an example signaling/communication protocol can be: (a) processor 120 pulls signal (I/O) line down to request a conversion/communication cycle; and (b) Sensor 110/210 responds by initiating a capture/conversion and communication cycle, pulsing down the signal (I/O) line 135 to generate the pulse train corresponding to the Pulse Count Data.

Figure 3:
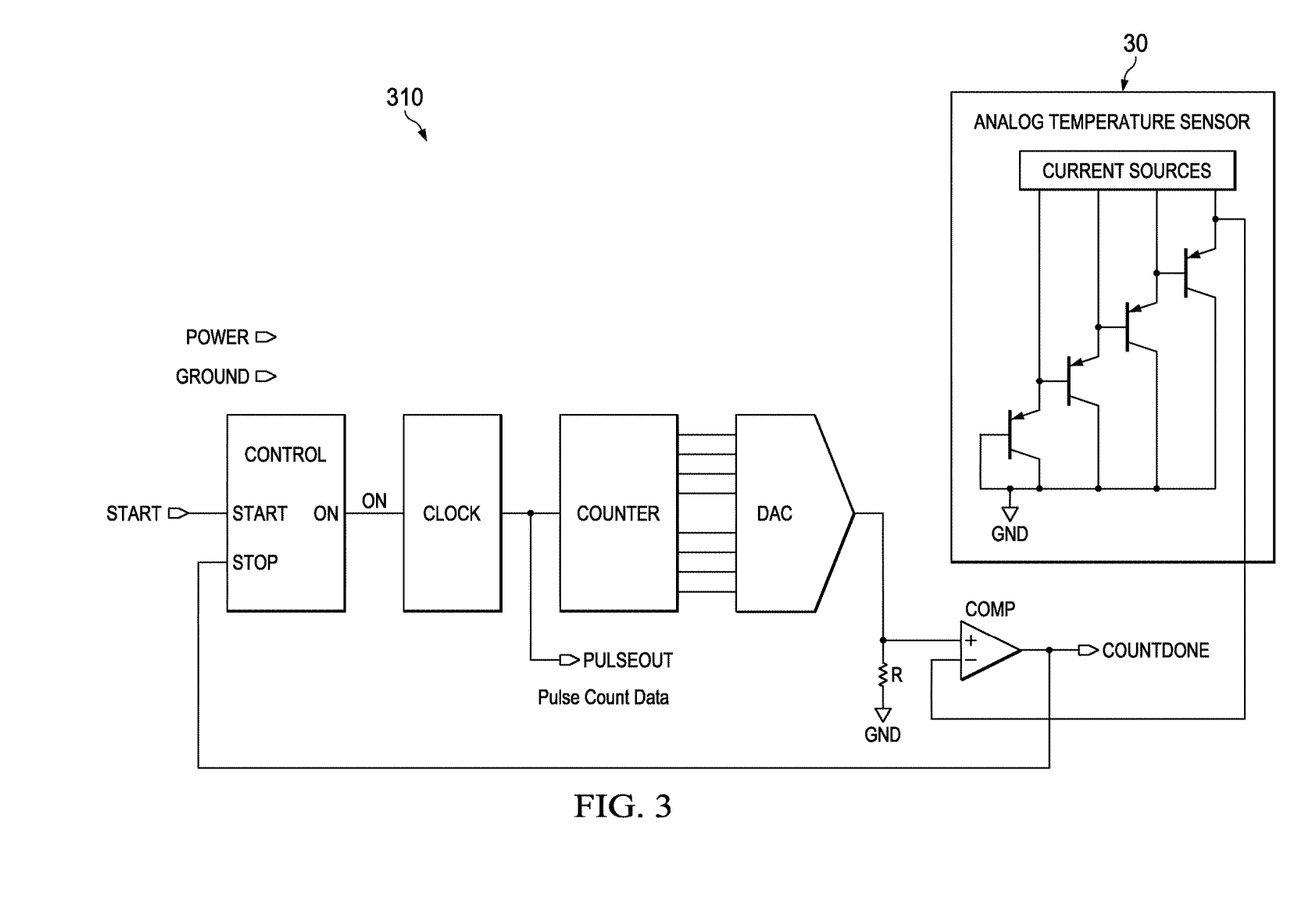
FIG. 3 illustrates an example 5/4-pin configuration: Power, Ground, Start (input), and PulseOut (pulse count output), with CountDone (Stop) (output) optional.
Figure 4:
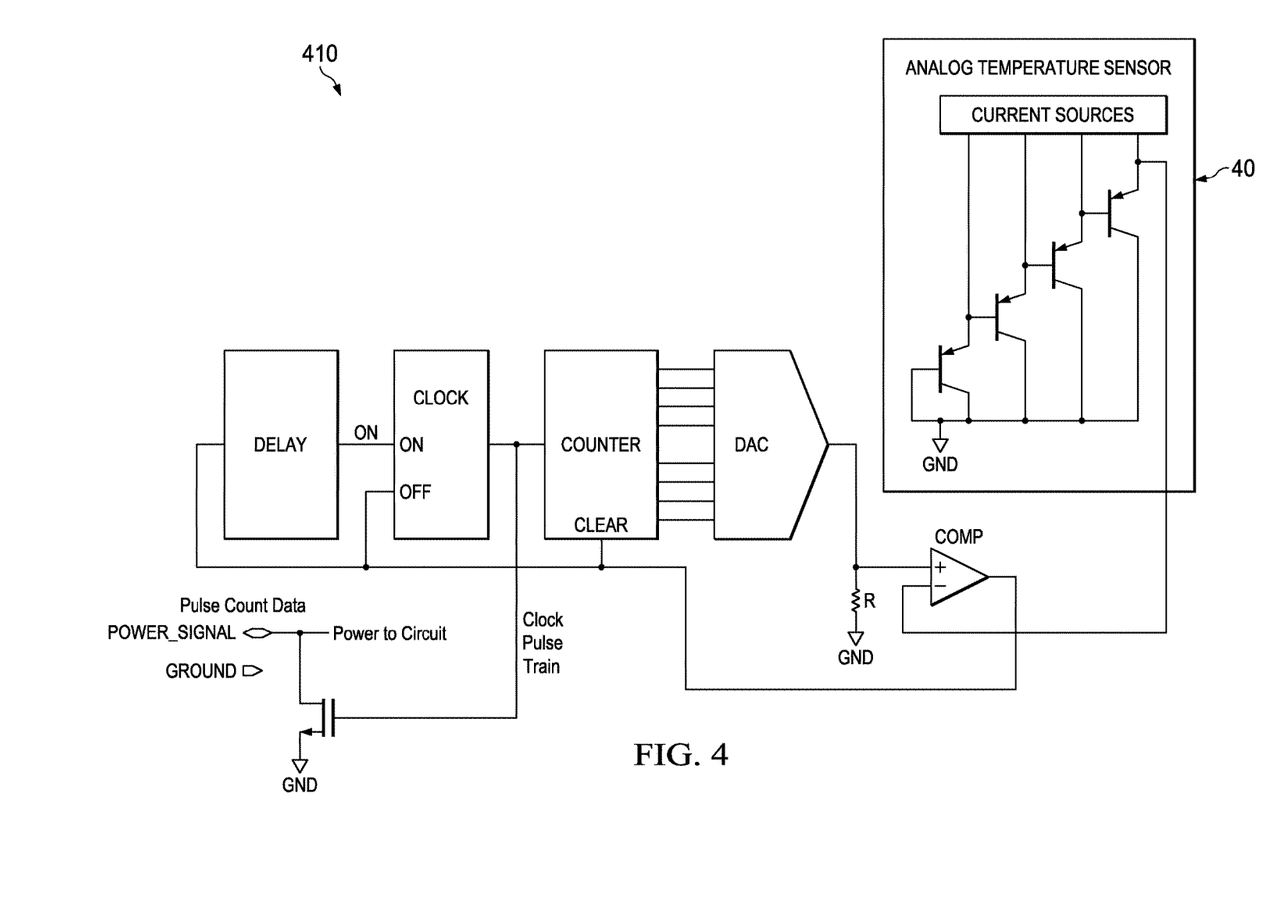
FIG. 4 illustrates an example 2-pin configuration: Power_Signal and Ground.
Figure 5:
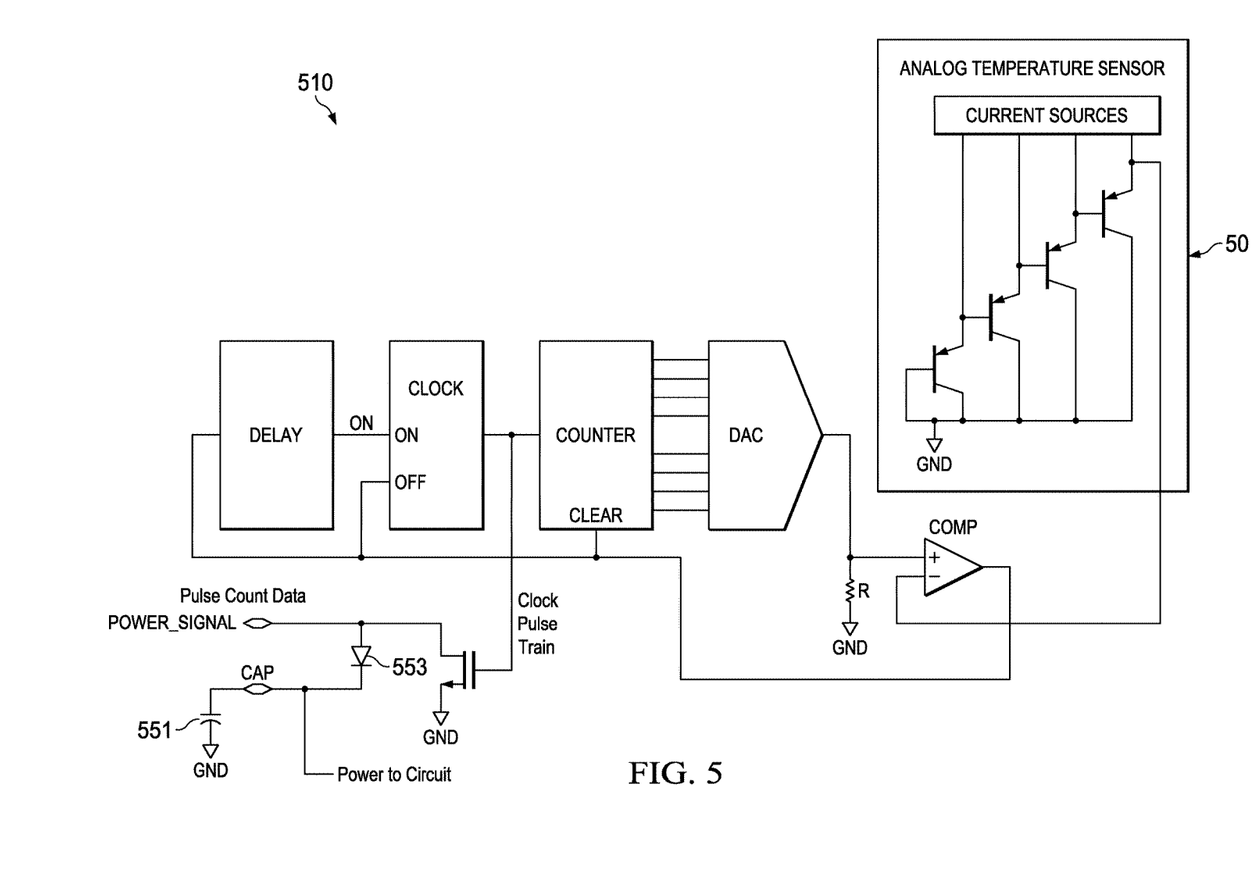
FIG. 5 illustrates an example 3-pin configuration of a temperature sensor IC with two wire signaling: Power_Signal and Ground, plus a Cap input (for parasitic power) to support rail-to-rail signaling).

FIGS. 3-5 illustrate example embodiments in which the methodology for capturing/converting analog information as Pulse Count Data according to aspects of the invention is adapted as a digital sensor configured for capturing analog temperature information.

That is, for each example embodiment, the analog sensor is an analog temperature sensor. For the illustrated example embodiments, the temperature sensor is illustrated as a Vbe stack structure. The selection of a suitable structure for the temperature sensor is a design choice.

For each example implementation, pulse count data generation is implemented with a DAC/comparator ADC, as in the example embodiment in FIG. 2. That is, clock train pulses from the DAC clock are driven out onto the signal line, forming the pulse train that comprises the Pulse Count Data.

As in the case of the example implementation illustrated in FIG. 2, the example implementations illustrated in FIGS. 3-5 are not configured for delayed communication, so that capture/conversion is not decoupled from communication. Accordingly, for these example implementations, Pulse Count Data is communicated during conversion.

FIGS. 3-5 illustrate example implementations of a digital sensor with different system interfaces (such as to a processor 120 in FIG. 1), i.e., with different example pin configurations: (a) FIG. 3 illustrates an example 5/4-pin configuration: Power, Ground, Start (input), and PulseOut (pulse count output), with CountDone (Stop) (output) optional; (b) FIG. 4 illustrates an example 2-pin configuration: Power_Signal and Ground; and (c) FIG. 5 illustrates an example 3-pin configuration with two wire signaling: Power_Signal and Ground, plus a Cap input (for parasitic power) able to support rail-to-rail signaling.

FIG. 3 illustrates an example implementation of a digital sensor 310, including an analog temperature sensor 30, with a 5-pin system interface configuration: Power, Ground, start (input), stop (output) and pulse (output). In an alternate example implementation, the 5-pin configuration can be modified as a 4-pin configuration, such as by eliminating the CountDone (Stop) output.

For the illustrated 5-pin configuration, an example signaling/communication protocol can be: (a) processor initiates a capture/conversion/communication cycle with a pulse to the sensor; (b) sensor performs a capture/conversion cycle, capturing the analog (temperature) information and converting to Pulse Count Data (DAC clock pulse train, or DAC count); (c) sensor transmits the Pulse Count Data (corresponding to the DAC clock pulse train, or DAC Count), by driving the Pulse Count Data onto the signal line; and (d) sensor terminates the capture/conversion cycle by generating a conversion_complete signal available to the processor at the CountDone pin.

For the example 4-pin configuration, the CountDone pin can be eliminated, and the processor can use a specified period of time with no pulses received as a "CountDone" indication. That is, the processor can "detect" the end of the pulse train as a predetermined period in which no pulse is received.

FIG. 4 illustrates an example implementation of a digital sensor 410, including an analog temperature sensor 40, with a 2-pin system interface configuration: power/signal and ground. An example signaling/communication protocol can be: (a) processor powers the sensor for example to 5V, which initiates a capture/conversion/communication cycle; and (b) sensor performs capture/conversion cycle, and communicates Pulse Count Data (corresponding to the DAC clock pulse train, or DAC Count) with down pulses on the power line (or up-pulses referenced to ground). For example, if during operation, the power line is at 5V, the sensor can be configured to communicate by pulsing down from 5V to 4V (or some other value within acceptable limits).

FIG. 5 illustrates an example implementation of a digital sensor 510, including an analog temperature sensor 50, with a 3-pin system interface configuration that supports two-wire communication: power/signal and ground, with a Cap pin for an external decoupling capacitor 551. Two-wire communication enables rail to rail signaling. Power to the sensor is maintained within acceptable limits by the decoupling capacitor 551 in conjunction with a rectifying diode 553.

The Disclosure provided by this Description and the Figures sets forth example embodiments and applications, including associated functions, operations and methods, that illustrate various aspects and features of the invention. These example embodiments and applications may be used by those skilled in the art as a basis for design modifications, substitutions and alternatives to construct other embodiments, including adaptations for other applications, Accordingly, this Description does not limit the scope of the invention, which is defined by the Claims.

The invention claimed is:

1. A circuit operable to convert analog information into digital data for communication to a remote processor, comprising:
   input circuitry configured to provide an input signal corresponding to the analog information;
   pulse count circuitry configured to convert the input signal into pulse count data in which the analog information is represented by a number of pulses; and
   data communication circuitry configured to transmit the pulse count data to the remote processor as pulse count comm data;
   the remote processor configured to receive the analog information by counting the received pulse count comm data.

2. The circuit of claim 1 wherein the input circuitry is configured to receive analog information from a sensor that senses a physical state and provides a corresponding sensor analog output corresponding to the analog information.

3. The circuit of claim 2, wherein the sensor senses temperature and the sensor analog output corresponds to the sensed temperature.

4. The circuit of claim 1 wherein the input circuitry includes a sensor that senses a physical state and provides a corresponding sensor analog output corresponding to the analog information.

5. The circuit of claim 4, wherein the sensor senses temperature and the sensor analog output corresponds to the sensed temperature.

6. The circuit of claim 1:
   wherein the input circuitry comprises conversion circuitry configured to convert the analog information to a digital representation; and
   wherein the pulse count circuitry is configured to convert the digital representation of the analog information into the pulse count data.

7. The circuit of claim 1:
   wherein the input circuitry comprises conversion circuitry including:
     digital counter circuitry responsive to a start count signal, and configured to output a digital count that increases according to a predetermined count frequency from the start count signal until a stop count signal is received;
     digital to analog conversion (DAC) circuitry configured to generate an analog DAC output that increases in magnitude corresponding to the increase in the digital count; and
     comparison circuitry configured to generate the stop count signal when the analog DAC output is substantially equal to an analog magnitude corresponding to the analog information;
   wherein the number of pulses in the pulse count data corresponds to a DAC count equal to the digital count between the start count signal and the stop count signal.

8. The circuit of claim 7, wherein the digital counter circuitry includes:
   DAC clock circuitry responsive to the start count and the stop count signal to output a train of clock pulses; and
   a DAC counter responsive to the clock pulse train to output a digital count that increases according to the number of clock pulses;
   such that the clock pulses correspond to the pulse count data.

9. The circuit of claim 1, further comprising storage circuitry, and:
   wherein the pulse count circuitry is configured to convert the input signal corresponding to the analog information into one of: (a) the pulse count data, and (b) pulse count information corresponding to the pulse count data;
   wherein the pulse count circuitry is configured to store into the storage circuitry respectively one of: (a) the pulse count data, and (b) the pulse count information; and
   wherein the pulse count circuitry is further configured to provide pulse count data to the data communication circuitry for communication as pulse count com data by one of: (a) retrieving the pulse count data from the storage circuitry, and (b) retrieving the pulse count information from the storage circuitry, and generating the pulse count data from the pulse count information.

10. A system for converting analog information into digital data for communication to a remote processor for processing, comprising:
    capture circuitry, including:
      input circuitry configured to provide an input signal corresponding to the analog information;
      pulse count circuitry configured to convert the analog information into pulse count data in which the analog information is represented by a number of pulses; and
      data communication circuitry configured to transmit the pulse count data as pulse count comm data; and
    a remote processor configured to receive the pulse count comm data from the capture circuitry, and convert the pulse count comm data into digital data corresponding to the analog information by counting the number of pulses in the pulse count comm data.

11. The system of claim 10 further comprising a sensor that senses a physical state and provides a corresponding sensor analog output corresponding to the analog information.

12. The system of claim 11, wherein the sensor senses temperature and the sensor analog output corresponds to the sensed temperature.

13. The system of claim 10:
    wherein the input circuitry comprises conversion circuitry including:
      digital counter circuitry responsive to a start count signal, and configured to output a digital count that increases according to a predetermined count frequency from the start count signal until a stop count signal is received;
      digital to analog conversion (DAC) circuitry configured to generate an analog DAC output that increases in magnitude corresponding to the increase in the digital count;
      comparison circuitry configured to generate the stop count signal when the analog DAC output is substantially equal to an analog magnitude corresponding to the analog information; and
    wherein the number of pulses in the pulse count data corresponds to a DAC count equal to the digital count between the start count signal and the stop count signal.

14. The circuit of claim 13, wherein the digital counter circuitry includes:
    DAC clock circuitry responsive to the start count and the stop count signal to output a train of clock pulses; and a DAC counter responsive to the clock pulse train to output a digital count that increases according to the number of clock pulses;

such that the clock pulses correspond to the pulse count data.

15. The system of claim 10, further comprising storage circuitry, and:

wherein the pulse count circuitry is configured to convert the analog information into one of: (a) the pulse count data, and (b) pulse count information corresponding to the pulse count data;

wherein the pulse count circuitry is configured to store into the storage circuitry respectively one of: (a) the pulse count data, and (b) the pulse count information; and wherein the pulse count circuitry is further configured to provide pulse count data to the data communication circuitry for communication as pulse count com data by one of: (a) retrieving the pulse count data from the storage circuitry, and (b) retrieving the pulse count information from the storage circuitry, and generating the pulse count data from the pulse count information.

\* \* \* \* \*